(12) United States Patent
Liu et al.

(10) Patent No.: US 12,484,184 B2
(45) Date of Patent: Nov. 25, 2025

(54) HIGH-VOLTAGE BUSHING AND HIGH-VOLTAGE POWER TRANSMISSION SYSTEM

(71) Applicants: State Grid Corporation of China, Beijing (CN); State Grid Smart Grid Research Institute Co., LTD., Beijing (CN)

(72) Inventors: Shan Liu, Beijing (CN); Zehong Liu, Beijing (CN); Shaowu Wang, Beijing (CN); Xianshan Guo, Beijing (CN); Yong Huang, Beijing (CN); Jin Zhang, Beijing (CN); Shengli Song, Beijing (CN); Jinzhong Li, Beijing (CN); Licheng Lu, Beijing (CN); Yunpeng Li, Beijing (CN); Jianhui Zhou, Beijing (CN); Hang Wang, Beijing (CN); Zhe Jiang, Beijing (CN); Junyi Hou, Beijing (CN)

(73) Assignees: STATE GRID CORPORATION OF CHINA, Beijing (CN); STATE GRID SMART GRID RESEARCH INSTITUTE CO., LTD., Beijing (CN)

( * ) Notice: Subject to any disclaimer, the term of this patent is extended or adjusted under 35 U.S.C. 154(b) by 284 days.

(21) Appl. No.: 18/027,047

(22) PCT Filed: Apr. 28, 2022

(86) PCT No.: PCT/CN2022/089814
§ 371 (c)(1),
(2) Date: Mar. 17, 2023

(87) PCT Pub. No.: WO2022/233261
PCT Pub. Date: Nov. 10, 2022

(65) Prior Publication Data
US 2023/0328918 A1 Oct. 12, 2023

(30) Foreign Application Priority Data

May 7, 2021 (CN) .......................... 202110497336.3

(51) Int. Cl.
*H02G 3/22* (2006.01)
*H05K 7/20* (2006.01)
*H02G 5/02* (2006.01)

(52) U.S. Cl.
CPC ..... *H05K 7/20209* (2013.01); *H05K 7/20145* (2013.01); *H05K 7/20172* (2013.01); *H02G 3/22* (2013.01); *H02G 5/02* (2013.01)

(58) Field of Classification Search
CPC ........ H01B 17/54; H01B 17/26; H01B 17/36; H02M 7/10
(Continued)

(56) References Cited

U.S. PATENT DOCUMENTS 2,953,629 A    9/1960  Lapp
4,358,631 A *  11/1982 Matsuda ................ H01B 17/54
                                                    174/15.2
(Continued)

FOREIGN PATENT DOCUMENTS

CN    101340067 A    1/2009
CN    101346779 B    10/2012
(Continued)

OTHER PUBLICATIONS

CN 106793701 translation and original (Year: 2017).*
(Continued)

*Primary Examiner* — Mandeep S Buttar
(74) *Attorney, Agent, or Firm* — Patterson + Sheridan, LLP

(57) ABSTRACT

A high-voltage bushing includes a conductive rod and an air cooling device. The conductive rod has an air channel
(Continued)

therein, and the air channel includes an air inlet and an air outlet. The air cooling device includes at least one fan, and the fan is configured to output air flow, so as to blow the air flow into the air channel through the air inlet.

17 Claims, 12 Drawing Sheets

(58) Field of Classification Search
USPC .......................................................... 361/695
See application file for complete search history.

(56) References Cited

U.S. PATENT DOCUMENTS

| | | | | |
|---|---|---|---|---|
| 5,386,192 | A * | 1/1995 | Marrone | H01B 17/54 324/552 |
| 8,049,587 | B2 * | 11/2011 | Israelsson Tampe | H01F 27/2876 336/59 |
| 2009/0126965 | A1 * | 5/2009 | Astrom | H01B 17/54 174/15.3 |
| 2010/0175905 | A1 | 7/2010 | Emilsson | |
| 2013/0192025 | A1 | 8/2013 | Taniyama et al. | |
| 2020/0395159 | A1 | 12/2020 | Liu et al. | |

FOREIGN PATENT DOCUMENTS

| | | | | |
|---|---|---|---|---|
| CN | 104332248 | A | | 2/2015 |
| CN | 205959749 | U | * | 2/2017 |
| CN | 106793701 | A | * | 5/2017 |
| CN | 208014453 | U | | 10/2018 |
| CN | 209880289 | U | | 12/2019 |
| CN | 113242573 | A | | 8/2021 |
| CN | 113242673 | A | | 8/2021 |
| CN | 214796879 | U | | 11/2021 |
| CN | 215500144 | U | | 1/2022 |
| CN | 216054017 | U | | 3/2022 |
| EP | 1906503 | A1 | * | 4/2008 ............... H02G 5/10 |
| EP | 1966807 | A1 | | 9/2008 |
| EP | 2131371 | A1 | | 12/2009 |
| EP | 2645379 | A1 | | 10/2013 |
| EP | 3065147 | A1 | * | 9/2016 ............. H01B 17/54 |
| EP | 3852123 | A1 | * | 7/2021 ............. H01B 17/54 |
| JP | S5024033 | B1 | | 8/1975 |
| JP | S5191800 | U | | 7/1976 |
| JP | S5244392 | U | | 3/1977 |
| JP | 2002140945 | A | | 5/2002 |
| JP | 2007266205 | A | | 10/2007 |
| JP | 4773242 | B2 | | 9/2011 |
| JP | 2013158135 | A | | 8/2013 |
| RU | 2399108 | C2 | | 9/2010 |
| RU | 2465668 | C2 | | 10/2012 |
| WO | 2007078226 | A1 | | 7/2007 |

OTHER PUBLICATIONS

CN 205959749 original and translation (Year: 2017).*
Japan Application No. 2023-519332, JP Office Action dated Jun. 4, 2024, with English translation, consists of 9 pages.
Korean Application No. 10-2023-7009524 KR Office Action dated Jun. 26, 2024, with English translation, consists of 11 pages.
International Search Report and Written Opinion, International Application No. PCT/CN2022/089814, dated Jun. 26, 2022.
European Search Report Application No. 22798602, Dated Feb. 5, 2025.
Chinese Application No. 202110497336.3 Office Action dated Dec. 18, 23024.
Chinese Application No. 202110497336.3 Office Action dated Dec. 18, 2024.
Russian Application No. 2023105906/07(012914), RU Office Action dated Oct. 18, 2023, with English translation, consists of 19 pages.
Australian Application No. 2022268459, Australian Office Action dated Oct. 30, 2023, consists of 3 pages.
Japan Application No. 2023-519332, JP Office Action dated May 28, 2024, with English translation, consists of 9 pages.
Korean Application No. 9-5-2024-053558211, JP Office Action dated Jun. 26, 2024, with English translation, consists of 11 pages.
International Search Report and Written Opinion, International Application No. PCT/CN2022/089814, dated Jun. 29, 2022.
Written Decision on Registration China Applicaiton No. 10-2023-7009524, dated Jun. 27, 2025.
Written Decision on Registration Korea Applicaiton No. 10-2023-7009524, dated Jun. 27, 2025.

* cited by examiner

A-A

HIGH-VOLTAGE BUSHING AND HIGH-VOLTAGE POWER TRANSMISSION SYSTEM

CROSS-REFERENCE TO RELATED APPLICATIONS

This application is a national phase entry under 35 USC 371 of International Patent Application No. PCT/CN2022/089814, filed on Apr. 28, 2022, which claims priority to Chinese Patent Application No. 202110497336.3, filed on May 7, 2021, which are incorporated herein by reference in their entirety.

TECHNICAL FIELD

The present disclosure relates to the field of power transmission technologies, and in particular, to a high-voltage bushing and a high-voltage power transmission system.

BACKGROUND

High-voltage power transmission is a way of boosting voltage, which is output by a generator, with a transformer in a power station and then transmitting the voltage. In a process of carrying the high-voltage power transmission, a high-voltage equipment used for carrying the high-voltage power transmission needs to withstand comprehensive influence of high voltage, large current and strong mechanical load for a long time, so there exist high electrical, thermal and mechanical stress inside.

SUMMARY

In an aspect, a high-voltage bushing is provided. The high-voltage bushing includes: a conductive rod and an air cooling device. The conductive rod having an air channel therein, and the air channel includes an air inlet and an air outlet. The air cooling device includes at least one fan, and the fan is configured to output air flow, so as to blow the air flow into the air channel through the air inlet.

In some embodiments, the air cooling device further includes: at least one sensor and a controller. The at least one sensor is configured to detect at least one of a pressure of the air flow output by the fan, a temperature of a bearing of the fan, a temperature of the conductive rod, or a temperature of the air flow. The controller is configured to control an operating state of the fan according to the at least one of the detected pressure of the air flow output by the fan, the detected temperature of the bearing of the fan, the detected temperature of the conductive rod, or the detected temperature of the air flow.

In some embodiments, the at least one sensor includes at least one of: a first temperature sensor, a second temperature sensor, at least one third temperature sensor, or a fourth temperature sensor. The first temperature sensor is located at the air inlet, and is configured to detect the temperature of the air flow before blowing into the air channel. The second temperature sensor is located at the air outlet, and is configured to detect a temperature of air flow flowing out of the air channel. The at least one third temperature sensor is located on an outer wall of the conductive rod, and each third temperature sensor is configured to detect the temperature of the conductive rod. The fourth temperature sensor is located on the bearing of the fan, and is configured to detect the temperature of the bearing of the fan.

In some embodiments, the at least one third temperature sensor includes a single third temperature sensor, and the single third temperature sensor is disposed on a middle of the outer wall of the conductive rod in an axial direction. Or the at least one third temperature sensor includes a plurality of third temperature sensors, and the plurality of third temperature sensors are disposed on the outer wall of the conductive rod and are spaced apart in the axial direction of the conductive rod. Or the air cooling device further includes a ventilation duct. The ventilation duct includes an air inlet duct, an inlet of the air inlet duct communicates with a tuyere of the fan, and an outlet of the air inlet duct communicates with the air inlet of the air channel. The at least one sensor further includes an air pressure sensor, and the air pressure sensor is configured to detect a pressure of an air flow in the air inlet duct.

In some embodiments, the air cooling device further includes a ventilation duct. The ventilation duct includes an air inlet duct, an inlet of the air inlet duct communicates with a tuyere of the fan, and an outlet of the air inlet duct communicates with the air inlet of the air channel.

In some embodiments, the air cooling device further includes a check valve disposed at the inlet of the air inlet duct, and the check valve is configured to allow the air flow generated by the fan to be blown into the air inlet duct, and prevent air flow in the air inlet duct from flowing back into the fan. And/or, the ventilation duct further includes an air outlet duct, and the air outlet duct communicates with the air outlet.

In some embodiments, the at least one fan includes a plurality of fans. And/or, the air cooling device further includes at least one air collecting hood, and each fan is disposed in a respective air collecting hood. The air collecting hood has an opening, and a the opening is perpendicular to a gravity direction of the air collecting hood. And/or, the air cooling device further includes a filter, and the filter is disposed at the air inlet and is configured to filter the air flow entering the air channel.

In some embodiments, the air channel further includes an air inlet channel and an air outlet channel, and a first end of the air inlet channel and a first end of the air outlet channel are located at a first end of the conductive rod. The air inlet is located at the first end of the air inlet channel, and the air outlet is located at the first end of the air outlet channel; and a second end of the air inlet channel and a second end of the air outlet channel communicate with each other at a position that is in the conductive rod and is adjacent to a second end of the conductive rod.

In some embodiments, the conductive rod further has a plurality of branch channels, and the plurality of branch channels communicate the air inlet channel with the air outlet channel.

In some embodiments, the conductive rod includes a conductive rod body in a hollow structure, and an air cooling pipe disposed in the conductive rod body and extending in an axial direction of the conductive rod body. A space inside the air cooling pipe forms the air inlet channel, and a space between an outer wall of the air cooling pipe and an inner wall of the conductive rod body forms the air outlet channel.

In some embodiments, the conductive rod further includes at least one support portion disposed in the air outlet channel, and the at least one support portion is clamped between the outer wall of the air cooling pipe and the inner wall of the conductive rod body.

In some embodiments, the support portion has a flow opening, and the flow opening extends through the support portion substantially in the axial direction of the conductive rod body.

In some embodiments, the conductive rod further includes a guide vane disposed on the outer wall of the air cooling pipe, and the guide vane is configured to guide air flow blown into the air outlet channel in a direction toward the air outlet. Or in an axial direction of the air cooling pipe, outer diameters of the air cooling pipe are not identical.

In some embodiments, the conductive rod includes a conductive rod body in a hollow structure, and a partition disposed in the conductive rod body and extending in an axial direction of the conductive rod body. The partition divides a space inside the conductive rod body into the air inlet channel and the air outlet channel in a thickness direction of the partition.

In some embodiments, the conductive rod is provided with a plurality of through holes therein, and the plurality of through holes each extend in an axial direction of the conductive rod and communicate with one another at an inner side of the second end of the conductive rod. A part of the plurality of through holes forms the air inlet channel, and another part forms the air outlet channel.

In some embodiments, among the plurality of through holes, a through hole located in a middle of the conductive rod forms the air inlet channel, and through holes located at an edge of the conductive rod form the air outlet channel.

In another aspect, a high-voltage power transmission system is provided. The high-voltage power transmission system includes: a high-voltage busbar and a high-voltage bushing. The high-voltage bushing is the above high-voltage bushing, and the conductive rod in the high-voltage bushing is connected to the high-voltage busbar.

In some embodiments, the high-voltage power transmission system further includes: a fitting, a first voltage equalizing ball and a second voltage equalizing ball. A first end of the high-voltage busbar is connected to a first end of the conductive rod in the high-voltage bushing through the fitting located in the first voltage equalizing ball, and a second end of the high-voltage busbar is located in the second voltage equalizing ball.

In some embodiments, the high-voltage power transmission system further includes a first voltage equalizing ball and a second voltage equalizing ball, and the fan is located in the first voltage equalizing ball or the second voltage equalizing ball. Or the high-voltage power transmission system further includes a voltage equalizing hood, the voltage equalizing hood is located at a first end of the high-voltage bushing, and the fan is located in the voltage equalizing hood. Or the high-voltage power transmission system further includes a plurality of voltage equalizing rings, the plurality of voltage equalizing rings are located at a side of the first end of the high-voltage bushing, and the fan is located between two adjacent voltage equalizing rings. Or the high-voltage power transmission system further includes a flange, the flange is located at the first end of the high-voltage bushing, and the fan is disposed at a side of the flange away from the conductive rod.

In some embodiments, the high-voltage power transmission system further includes: a high-potential energy extraction device. An output terminal of the high-potential energy extraction device is connected to the air cooling device, and the high-potential energy extraction device is configured to extract electrical energy from the high-voltage busbar and supply power to the air cooling device.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person having ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
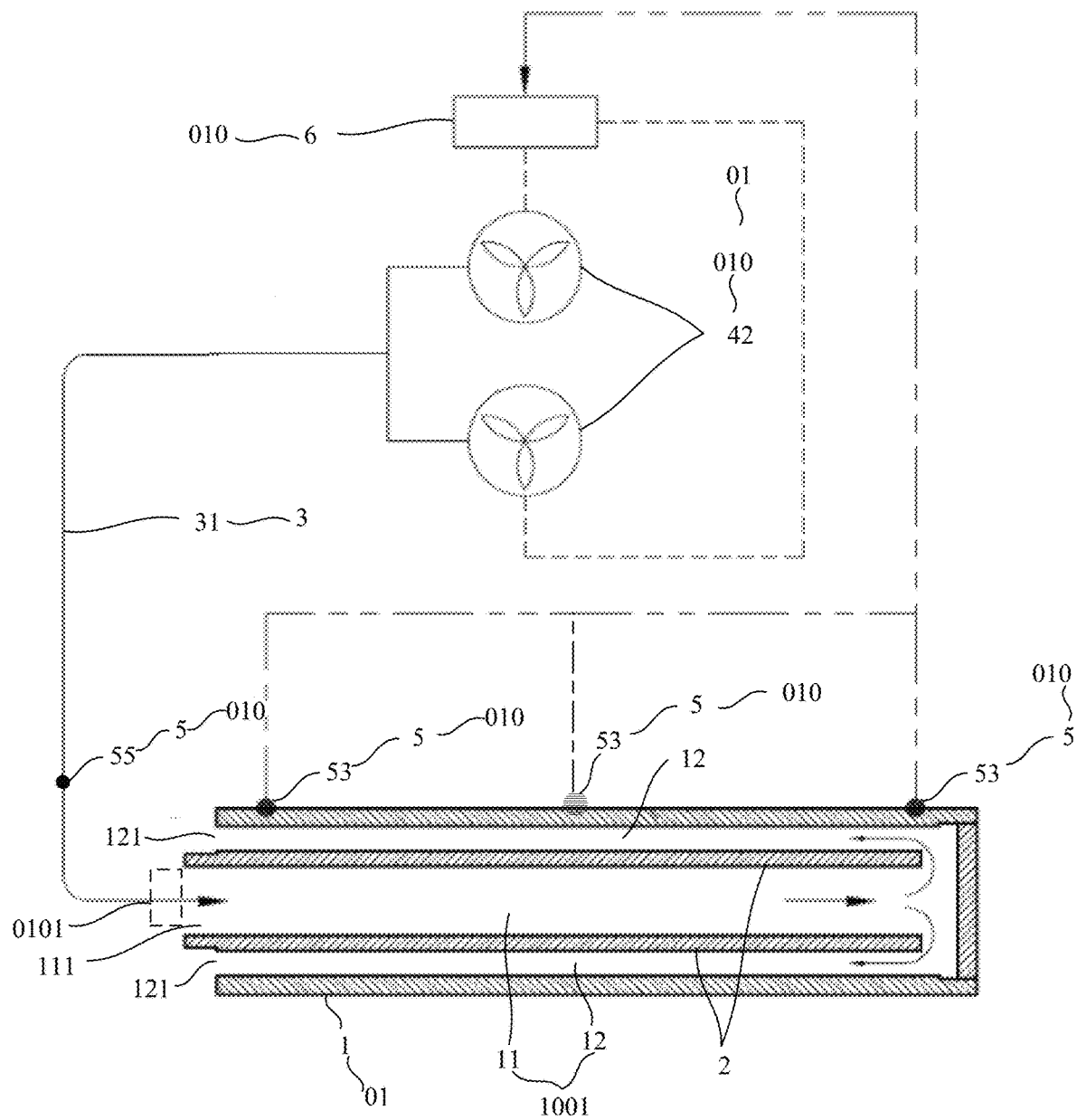
FIG. 1 illustrates a connection diagram showing a high-voltage bushing, in accordance with some embodiments.

Technical solutions in some embodiments of the present disclosure will be described clearly and completely with reference to the accompanying drawings below. However, the described embodiments are merely some but not all embodiments of the present disclosure. All other embodiments acquired by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more features. In the description of the embodiments of the present disclosure, the term "a plurality of" or "the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5 degrees; the term "perpendicular" includes absolute perpendicularity and approximate perpendicularity, and an acceptable range of deviation of the approximate perpendicularity may also be, for example, a deviation within 5 degrees. The term "equal" includes absolute equality and approximate equality, and an acceptable range of deviation of the approximate equality may be, for example, a difference between two equals of less than or equal to 5% of either of the two equals.

A converter station is a station built to complete a conversion of alternating current to direct current or a conversion of direct current to alternating current in a process of high-voltage power transmission. The core of the converter station is a valve hall. The valve hall is provided with a converter valve therein. The converter valve is a core equipment of a power transmission project. A converter transformer is a power transformer in the power transmission project. The converter transformer is connected to the converter valve through a high-voltage bushing and a high-voltage busbar to complete the power transmission project together.

Figure 11:
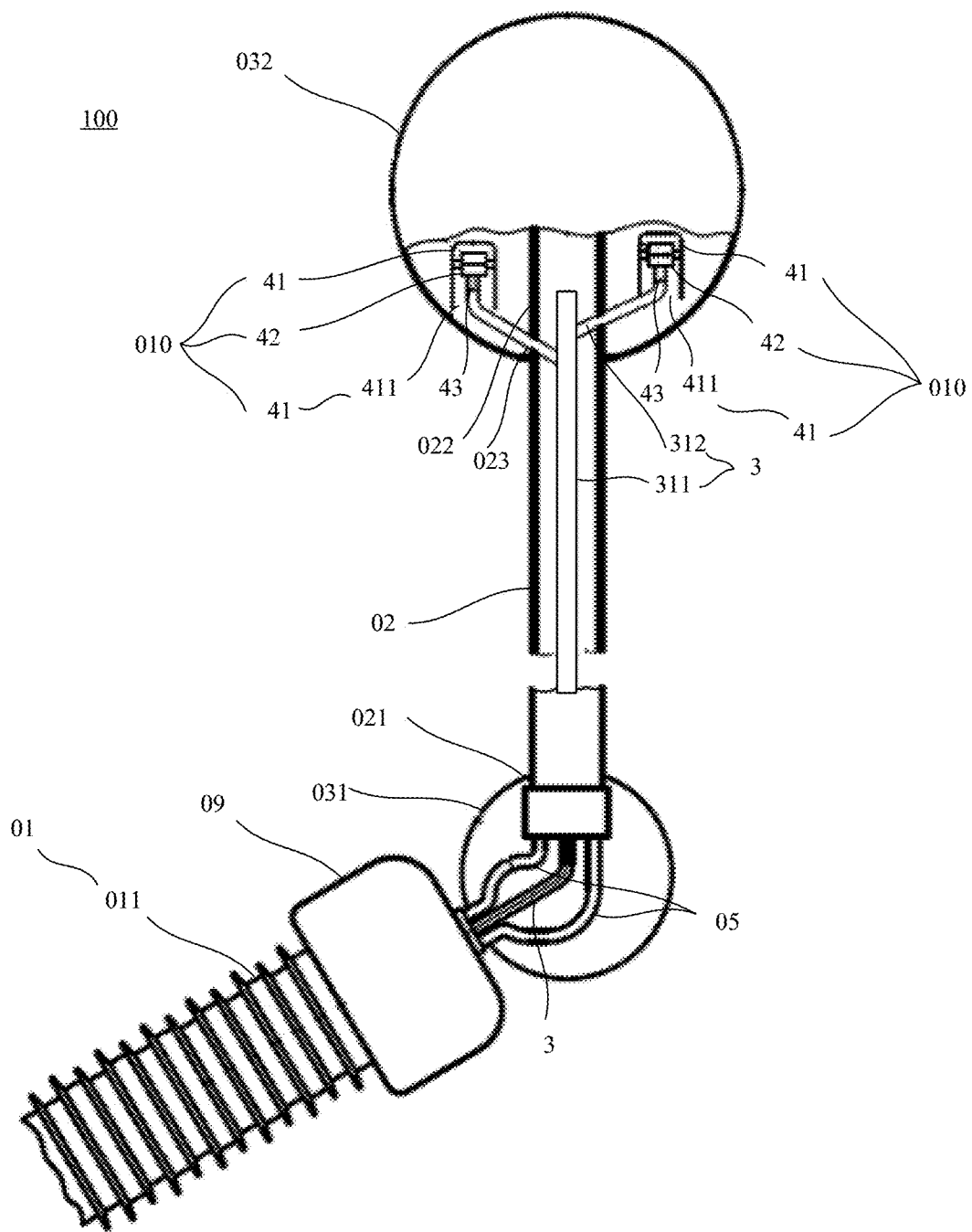
FIG. 11 illustrates a structural diagram showing a high-voltage power transmission system in which fans are disposed in a second voltage equalizing ball, in accordance with some embodiments.

Some embodiments of the present disclosure provide a high-voltage power transmission system 100. As shown in FIG. 11, the high-voltage power transmission system 100 includes a high-voltage busbar 02 and a high-voltage bushing 01. The high-voltage bushing 01 includes a conductive rod and an insulating sleeve 011 wrapped around the conductive rod. The conductive rod in the high-voltage bushing 01 is connected to the high-voltage busbar 02.

In some embodiments, as shown in FIG. 11, the high-voltage power transmission system 100 further includes a fitting 05, a first voltage equalizing ball 031 and a second voltage equalizing ball 032. A first end 021 of the high-voltage busbar 02 and a first end of the conductive rod of the high-voltage bushing 01 are connected through the fitting 05 located in the first voltage equalizing ball 031, and a second end 022 of the high-voltage busbar 02 is located in the second voltage equalizing ball 032. The fitting (also known as an armour clamp) is an iron or aluminum metal accessory widely used in power transmission lines. As shown in FIG.

11, the high-voltage bushing 01 is connected to the fitting 05, and the high-voltage bushing 01 is connected to the first end 021 of the high-voltage busbar 02 through the fitting 05.

A high-voltage equipment is subjected to comprehensive influence of high voltage, high current and strong mechanical load during long-term operation, so there are high electrical, thermal and mechanical stress inside. As shown in FIG. 1, the conductive rod 1 inside the high-voltage bushing 01 is easy to generate a certain amount of heat because it plays a role of current carrying. If the heat cannot be dissipated in time, the heat inside the high-voltage bushing 01 will continue to accumulate, so that the temperature of the high-voltage bushing 01 continues to rise, which may cause insulation failure of the high-voltage bushing 01.

In order to solve the problem that the internal temperature of the high-voltage bushing 01 is too high, there are two common solutions.

One solution is to change the volume and size of the high-voltage bushing 01 on the basis of traditional natural cooling. By increasing the size (e.g., diameter) of the conductive rod, its specific heat capacity and heat dissipation area are increased, which reduces heat generated by the conductive rod. However, the manufacturing cost will increase in this solution due to the increased size and weight of the high-voltage bushing 01.

The other solution is to adopt a liquid cooling method, e.g., using a converter valve cooling system to guide a cooling medium (e.g., cooling liquid) in the converter valve cooling system into the conductive rod of the high-voltage bushing 01. In this way, the conductive rod is fully cooled, and then the cooling liquid flows from the conductive rod to the converter valve cooling system. However, since the cooling liquid needs to flow between the converter valve cooling system and the conductive rod, there may be a risk that the cooling liquid leaks into the high-voltage bushing 01 and the valve hall of the converter valve in the flow process, which causes a great safety hazard.

In light of this, some embodiments of the present disclosure provide a high-voltage bushing 01. As shown in FIG. 1, the high-voltage bushing 01 includes the conductive rod 1 and an air cooling device 010. The conductive rod 1 is provided with an air channel 1001 therein, and the air channel 1001 includes an air inlet 111 and an air outlet 121. The air cooling device 010 includes at least one fan 42, and the fan 42 is configured to output air flow, so as to blow the air flow into the air channel 1001 through the air inlet 111.

The air flow blown from a tuyere of the fan 42 may be blown into the air channel 1001 through the air inlet 111, so that an air convection phenomenon occurs inside the conductive rod 1, so as to bring the heat inside the conductive rod 1 out. As a result, the temperature of the high-voltage bushing 01 can be reduced, and a situation that the insulation failure of the high-voltage bushing 01 due to an excessive temperature can be avoided.

According to the high-voltage bushing 01 in some embodiments of the present disclosure, external air flow can be blown into the air channel 1001 inside the conductive rod 1 through the fan 42, and the high-voltage bushing 01 is cooled according to the principle of air convection. In this way, on the premise of maintaining the original size of the high-voltage bushing 01 and avoiding the cooling medium leakage, the high-voltage bushing 01 may effectively dissipate heat.

In order to ensure the normal operation of the air cooling device 010, in some embodiments, the air cooling device 010 includes a plurality of fans 42. The fan 42 may be of an induced air type or an air blast type.

For example, as shown in FIG. 1, the air cooling device 010 includes two fans 42.

For example, the two fans 42 may operate at the same time, which may increase an air inlet volume and improve a cooling efficiency of the conductive rod 1. For another example, of the two fans 42, when one fan 42 is operating, and the other fan 42 is standby. When the fan 42 in the operating state breaks down, the other fan 42 starts operating. The operation modes of the two fans 42 may be adaptively selected depending on actual needs.

Of course, the air cooling device 010 may include a single fan 42.

In order to supply power to each fan 42, the high-voltage power transmission system 100 may further include a power supply device. The power supply device may be of various types. For example, a household 110 V to 220 V alternating current power supply device may be used to supply power to each fan 42; alternatively, each fan 42 is powered by a battery provided therein. In order to conveniently and effectively provide long-term power supply to each fan 42, the power supply device includes a high-potential energy extraction device. The high-potential energy extraction device is configured to extract electrical energy from the high-voltage busbar 02, convert the electrical energy into reliable low-voltage electricity, and supply power to the fan 42.

For example, the high-potential energy extraction device can use electromagnetic coils to acquire energy or use capacitors to acquire electricity, so as to supply power to the fan 42.

It will be noted that the electrical energy acquired by the high-potential energy extraction device may be alternating current or direct current, so as to meet different power consumption requirements of the fan 42.

Figure 16:
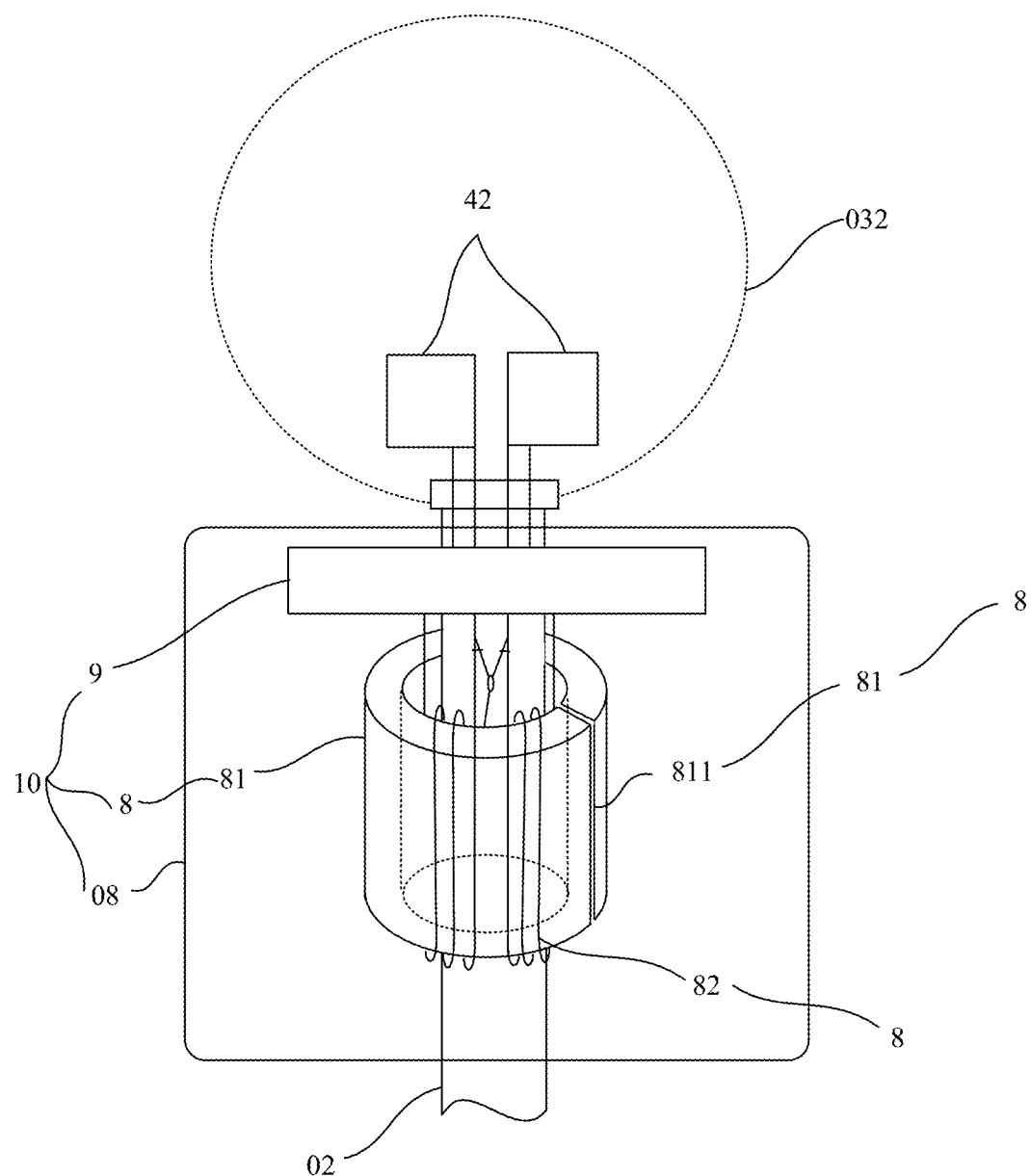
FIG. 16 illustrates a structural diagram showing an inductive energy extraction device in a high-voltage power transmission system, in accordance with some embodiments.

FIG. 16 shows a high-potential energy extraction device (i.e., an inductive energy extraction device) 10 that can acquires energy according to the principle of electromagnetic induction. The inductive energy extraction device 10 includes a current transformer 8 and a power supply circuit 9. The current transformer 8 is arranged on the periphery of the high-voltage busbar 02, and can generate low-voltage alternating current through electromagnetic induction. The power supply circuit 9 is configured to convert the electrical energy generated by the current transformer 8 into a constant low-voltage direct current. In this way, energy can be acquired locally at the high-voltage busbar 02 according to the principle of electromagnetic induction, so as to supply power to the fan 42.

The current transformer 8 induces a voltage on the periphery of the high-voltage busbar 02 according to the principle of electromagnetic induction. Since the voltage induced by the current transformer 8 cannot be directly supplied to loads such as the fan 42, the inductive energy extraction device 10 further includes the power supply circuit 9. The electrical energy acquired by the current transformer 8 may be processed through the power supply circuit 9, and finally stable direct current power suitable for the fan 42 is acquired to supply power to the fan 42.

In some embodiments, as shown in FIG. 16, the current transformer 8 includes a magnetic core 81 and one or more metal coils 82. The magnetic core 81 is substantially of a cylindrical structure and surrounds an outer wall of the high-voltage busbar 02, and the metal coil 82 is wound on the surface of the magnetic core 81. Therefore, a voltage may be induced at a position of the high-voltage busbar 02 according to the principle of electromagnetic induction.

For example, the magnetic core 81 has one or more air gaps 811, the air gap 811 may extend substantially in a direction parallel to an axis of the magnetic core 81, and a length of the air gap 811 is substantially equal to an axial length of the magnetic core 81. The magnetic core 81 may be made of a soft magnetic material.

In some embodiments, as shown in FIG. 16, the inductive energy extraction device 10 further includes a shielding shell 08, and the current transformer 8 and the power supply circuit 9 are arranged in the shielding shell 08. Electromagnetic radiation can be shielded by the shielding shell 08, thereby preventing an external environment from affecting the operation of the current transformer 8 and the power supply circuit 9.

Figure 17:
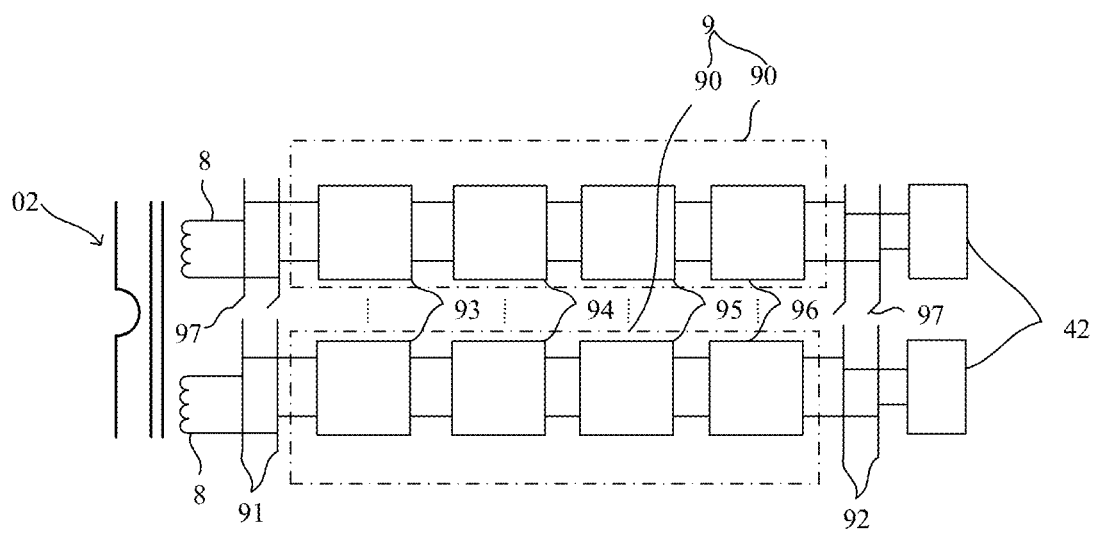
FIG. 17 illustrates a principle diagram showing an inductive energy extraction device in a high-voltage power transmission system, in accordance with some embodiments.

In some embodiments, as shown in FIG. 17, the power supply circuit 9 includes a primary alternating current busbar 91, a secondary direct current busbar 92 and electrical energy conversion circuit(s) 90. The electrical energy conversion circuit 90 is connected in parallel between the primary alternating current busbar 91 and the secondary direct current busbar 92 (an output terminal of the high-potential energy extraction device).

The metal coil 82 of the current transformer 8 is connected in parallel to the primary alternating current busbar 91 of the power supply circuit 9. The electrical energy of the high-voltage busbar 02 is acquired through the current transformer 8, and then the electrical energy is collected to the primary alternating current bus 91, and the subsequent power conversion circuit 90 takes the electrical energy from the primary alternating current bus 91. After the electrical energy acquired by the current transformer 8 is converted by the electrical energy conversion circuit 90, a low-voltage direct current with stable voltage is acquired, and the low-voltage direct current is collected on the secondary direct current busbar 92 to supply power to the fan 42.

As shown in FIG. 17, the electrical energy conversion circuit 90 includes a rectifier filter circuit 95 and a direct current voltage stabilizer circuit 96. A low-voltage direct current is acquired through the rectifier filter circuit 95, and the low-voltage direct current may be converted into the low-voltage direct current with stable and adjustable voltage through the direct current voltage stabilizer circuit 96.

The rectifier filter circuit 95 may adopts a circuit including a transformer, a mainstream main circuit, a filter, and the like. The rectifier filter circuit 95 may adopt an uncontrolled rectifier circuit to convert alternating current into direct current, and then the direct current voltage stabilizer circuit 96 performs direct current voltage stabilizing through a direct current voltage buck circuit to convert the direct current into the direct current with stable and adjustable voltage, where an adjustment range of the direct current is 20 V to 58 V, inclusive (e.g., 20 V, 30 V, 40 V, 50 V, or 58 V). Then the direct current is collected to the secondary direct current busbar 92 to supply power to the fan 42.

In some embodiments, as shown in FIG. 17, the power conversion circuit 90 further includes a front-end surge protection branch 93, which is configured to protect the subsequent power supply circuits and chips. For example, the front-end surge protection branch 93 may adopt bi-polar transient voltage suppressor diodes.

In some embodiments, as shown in FIG. 17, a resonant circuit 94 is connected in parallel between the front-end surge protection branch 93 and the rectifier filter circuit 95. Through the resonant circuit 94, the self-inductance of the metal coil 82 may be reduced, and a secondary output voltage may be increased. For example, the resonant circuit 94 may include a resonant capacitor.

In order to ensure the normal operation of the inductive energy extraction device 10, as shown in FIG. 17, the power supply circuit 9 includes two power conversion circuits 90. The primary alternating current busbar 91 and the secondary direct current busbar 92 are each provided with switches 97 thereon.

In this case, the power supply circuit 9 has two operation modes.

In the first operation mode, switches 97 on the primary alternating current busbar 91 and the secondary direct current busbar 92 are all closed, and when one power conversion circuit 90 breaks down, energy acquired by a metal coil 82 corresponding thereto is distributed to the other power conversion circuit 90.

In the second operation mode, the switches 97 on the primary alternating current bus 91 and the secondary direct current bus 92 are all opened, and each metal coil 82 is connected to a single power conversion circuit 90, and corresponds to a single fan 42 to form two independent operating circuits. In the two independent operating circuits, when one operates normally, the other serves as the backup circuit. When a circuit that is operating breaks down, the other circuit is started to continue to operate to ensure the normal operation of the circuit.

Based on the above power supply device, the control method of the fan 42 may be performed according to the following examples.

In the first control method, the power supply device outputs electrical energy with a preset power. The fan 42 operates under the control of the power supply device. In a case where the high-voltage bushing 01 does not include a sensor 5 and a controller 6, the power supply device may output the electrical energy with three different powers. For example, the power supply device may output the electrical energy with 0 power, A power and B power, separately. A and B each refer to a value of a certain power, which may be set depending on actual situations. Different service powers correspond to different fan speeds.

In the second control method, the output power of the power supply device is adjusted depending on requirements. For example, in a case where the high-voltage bushing 01 includes sensor(s) 5 (e.g., the sensor(s) 5 including: a plurality of temperature sensors arranged at the air inlet 111 of the conductive rod 1, the air outlet 121 of the conductive rod 1, and typical positions (e.g., a middle position) of the conductive rod 1, and an air pressure sensor 55 disposed in a ventilation duct 3) and the controller 6, after receiving information fed back by the sensor(s) 5, the controller 6 controls the power supply device to output the electrical energy with a suitable power, so that the fan 42 can run at a suitable speed.

In the third control method, the power supply device outputs constant electrical energy, and the speed of the fan 42 is directly controlled by the controller 6. In this control method, the power supply device outputs the constant electrical energy, and the controller 6 directly controls the speed of the fan 42 through the information fed back by the sensor(s) 5 for real-time adjustment. In this control method, an arrangement manner of the sensor(s) 5 is the same as an arrangement manner in the second control method, which will not be repeated here.

In some embodiments, when the high-voltage bushing 01 is applied to the high-voltage power transmission system 100, as shown in FIG. 11, the high-voltage bushing 01 further includes the insulating sleeve 011 arranged outside the conductive rod 1, and the insulating sleeve 011 can play an insulating role.

During the operation of the high-voltage power transmission system 100, heat is continuously generated inside the conductive rod 1, and the insulating sleeve 011 located on the outside of the conductive rod 1 will cause the heat not to be effectively dissipated. If the high-voltage bushing 01 cannot effectively dissipate heat, the temperature of the high-voltage bushing 01 will rise, resulting in the insulation failure of the high-voltage bushing 01. In the embodiments of the present disclosure, the fan 42 of the air cooling device 010 can blow the air flow blown from the tuyere of the fan 42 into the air channel 1001 inside the conductive rod 1, so that the high-voltage bushing 01 is cooled through air convection. In this way, on the premise of maintaining the original size of the high-voltage bushing 01 and avoiding the leakage of the cooling medium, the high-voltage bushing 01 may realize efficient heat dissipation.

In addition, the conductive rod 1 may be made of a metal material with good conductivity. For example, the material may be copper or aluminum. By using the aluminum to fabricate the conductive rod 1, an overall weight of the high-voltage bushing 01 may be greatly reduced.

In addition, since the insulating sleeve 011 and the conductive rod 1 have a gap therebetween, a discharge phenomenon may occur. In order to maintain good insulation performance, the conductive rod 1 and the insulating sleeve 011 may be further provided with an insulator therebetween.

For example, the insulator may be a capacitor core, and the capacitor core mainly includes a metal liner tube and an epoxy resin glue-impregnated paper insulating structure wrapped around an outer periphery of the metal liner tube.

The fan 42 in the air cooling device 010 may be arranged in the second voltage equalizing ball 032, or arranged at the first end of the conductive rod 1 (e.g., the fan 42 is arranged in the first voltage equalizing ball 031 or at a side of the first voltage equalizing ball 031 proximate to the first end of the conductive rod 1).

In a case where the fan 42 is arranged in the second voltage equalizing ball 032, the second voltage equalizing ball 032 may have a large size. For example, the size of the second voltage equalizing ball 032 may be larger than that of the first voltage equalizing ball 031.

In some embodiments, as shown in FIGS. 1 and 2, or FIGS. 11 and 12, the air cooling device 010 further includes a ventilation duct 3, and the ventilation duct 3 may include an air inlet duct 31. An inlet of the air inlet duct 31 communicates with the tuyere of the fan 42, and an outlet of the air inlet duct 31 communicates with the air inlet 111. The air inlet duct 31 is configured to guide the air flow blown out by the fan 42 into the air channel 1001 of the conductive rod 1.

Figure 12:
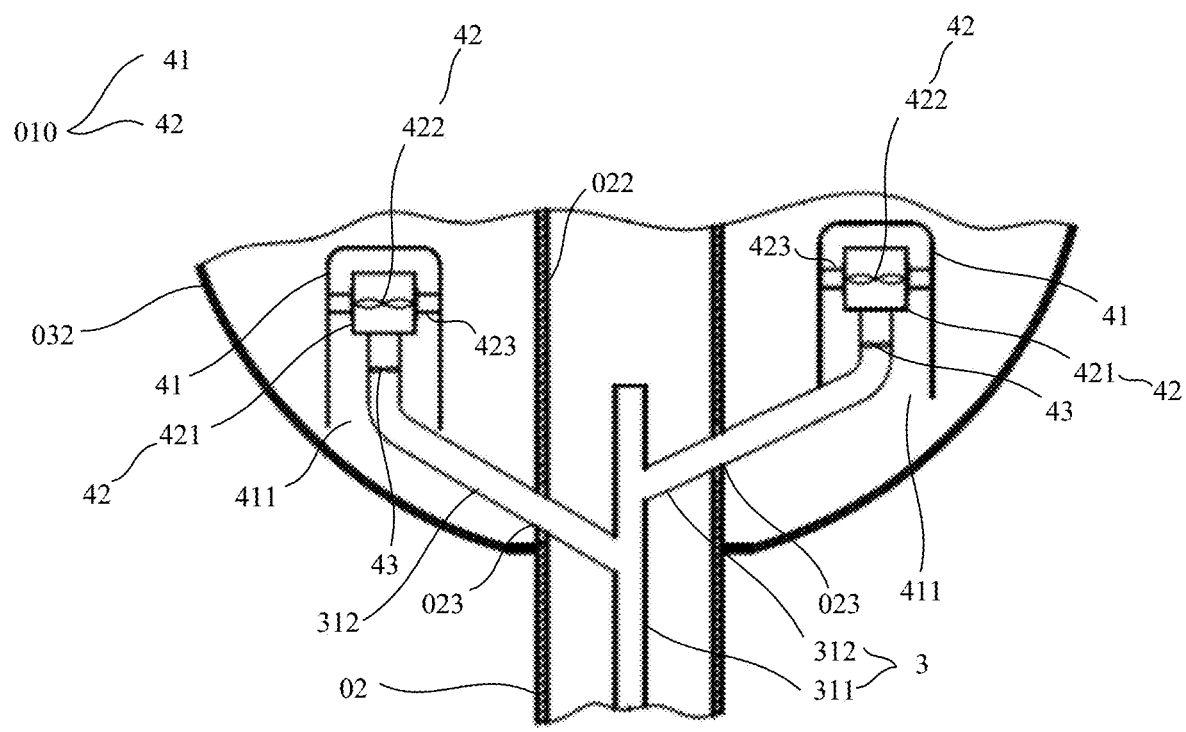
FIG. 12 illustrates a partial enlarged view of FIG. 11.

In a case where the fan 42 is arranged in the second voltage equalizing ball 032, for example, as shown in FIGS. 11 and 12, the air inlet duct 31 includes a main passage 311 and at least one branch 312 communicating with the main passage 311. The main passage 311 is located in the high-voltage busbar 02 and extends in an axial direction of the high-voltage busbar 02. A portion, located in the second voltage equalizing ball 032, of the high-voltage busbar 02 has through hole(s) 023, and each branch 312 of the ventilation duct 3 extends to an outside of the high-voltage busbar 02 through a respective through hole 023 and is connected to a fan 42 located in the second voltage equalizing ball 032. In this way, the fan may be prevented from generating an electromagnetic field in an external environment, and then the influence of the electromagnetic field on the external environment may be avoided.

It will be noted that, in a case where the air cooling device 010 includes a plurality of fans 42, the plurality of through holes 023 may be arranged at different positions in the high-voltage busbar 02, so that the plurality of through holes 023 in the high-voltage busbar 02 are staggered. In this way, the effect of the plurality of through holes 023 on the current carrying of the high-voltage busbar 02 may be reduced.

Figure 2:
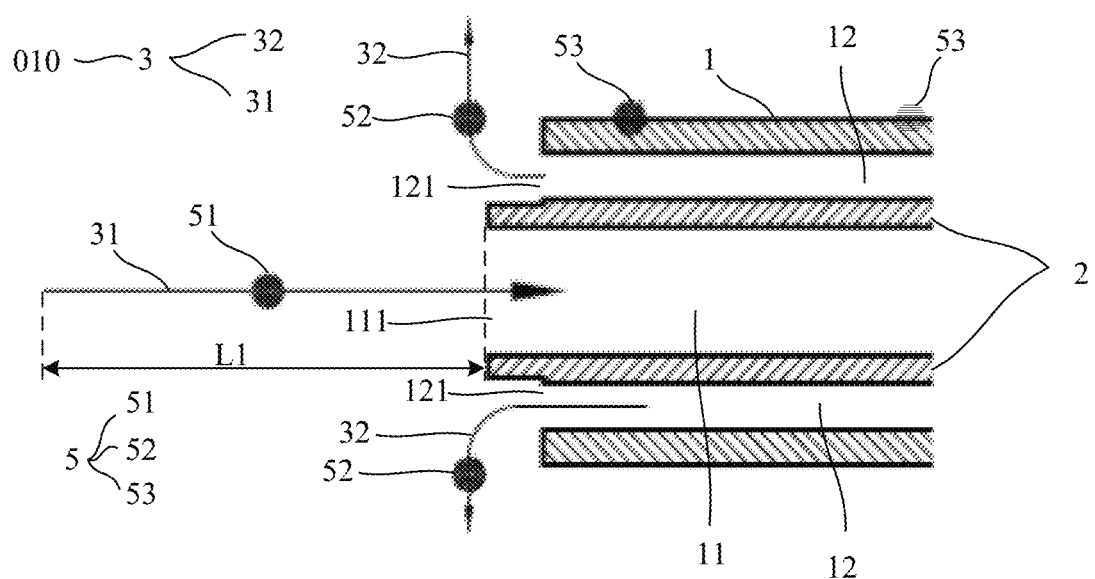
FIG. 2 illustrates a schematic diagram showing a connection between a conductive rod and a ventilation duct in a high-voltage bushing, in accordance with some embodiments.

For example, as shown in FIGS. 1 and 2, the ventilation duct 3 includes the air inlet duct 31 and an air outlet duct 32. The inlet of the air inlet duct 31 communicates with the tuyere of the fan 42, and the outlet of the air inlet duct 31 communicates with the air inlet 111. The air outlet duct 32 communicates with the air outlet 121.

In a case where the air cooling device 010 includes the plurality of fans 42, tuyeres of the plurality of fans 42 may correspond to the same ventilation duct 3.

It will be noted that, the air inlet duct 31 and the air inlet 111 may be connected through welding or screw connection, and the air outlet duct 32 and the air outlet 121 may be connected through welding or screw connection. The ventilation duct 3 may be a light metal piece or a plastic piece.

The ventilation duct 3 may guide air flow (e.g., cold air flow) entering the conductive rod 1 and air flow (e.g., hot air flow) blown out from the conductive rod 1. The air inlet duct 31 is connected to the air inlet 111, and air flow blown out from the tuyere of the fan 42 may be blown into the air inlet 111 through the air inlet duct 31, and the air flow cools the inside of the conductive rod 1 in the air channel 1001 and then is blown out from the air outlet duct 32 through the air outlet 121.

In some embodiments, as shown in FIG. 2, a first end of the air inlet duct 31 is connected to the air inlet 111, and a first end of the air outlet duct 32 is connected to the air outlet 121. A second end of the air inlet duct 31 is located at a certain distance (e.g., the distance L1 in FIG. 2) from the first end of the conductive rod 1, and a second end of the air outlet duct 32 is located at the first end of the conductive rod 1. For example, the second end of the air inlet duct 31 and the first end of the conductive rod 1 have the certain distance L1 therebetween, and the second end of the air outlet duct 32 is located near the air outlet 121.

Figure 3:
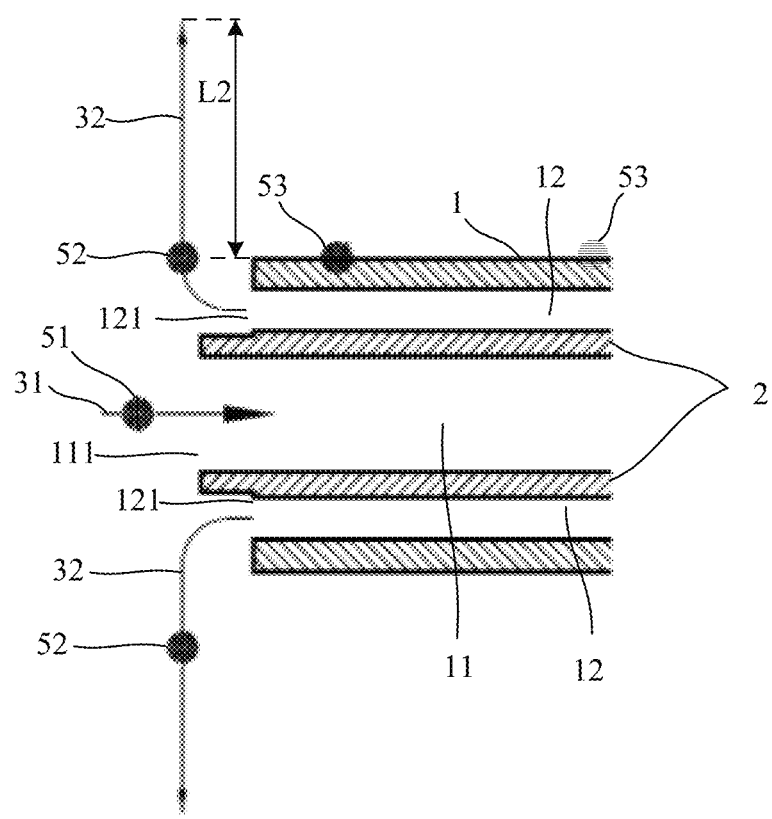
FIG. 3 illustrates a schematic diagram of a connection between a conductive rod and another ventilation duct in a high-voltage bushing, in accordance with some embodiments.

In some embodiments, as shown in FIG. 3, the first end of the air inlet duct 31 is connected to the air inlet 111, and the second end of the air inlet duct 31 is located at the first end of the conductive rod 1. The first end of the air outlet duct 32 is connected to the air outlet 121, and the second end of the air outlet duct 32 is located at a certain distance (e.g., the distance L2 in FIG. 3) from the first end of the conductive rod 1. A length of the air inlet duct 31 in FIG. 3 is less than the length of the air inlet duct 31 in FIG. 2, and a length of the air outlet duct 32 in FIG. 3 is greater than the length of the air outlet duct 32 in FIG. 2.

Figure 4:
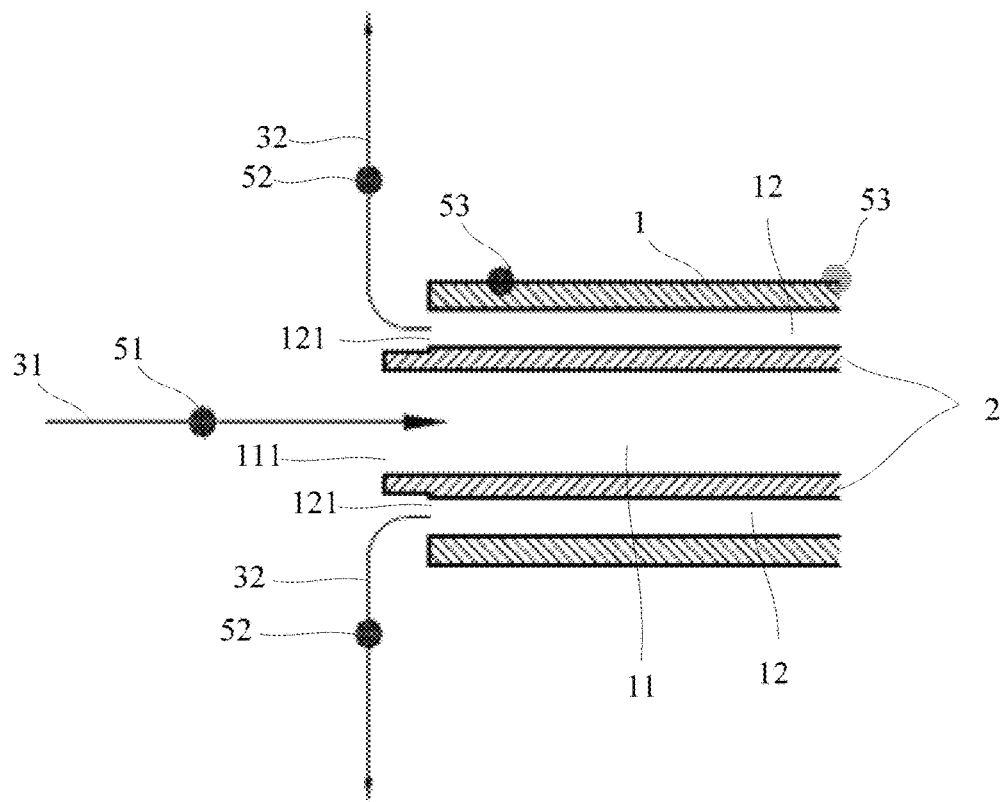
FIG. 4 illustrates a schematic diagram of a connection between a conductive rod and yet another ventilation duct in a high-voltage bushing, in accordance with some embodiments.

In some embodiments, as shown in FIG. 4, the first end of the air inlet duct 31 is connected to the air inlet 111, and the first end of the air outlet duct 32 is connected to the air outlet 121. The second end of the air inlet duct 31 and the second end of the air outlet duct 32 are each located at a certain distance from the first end of the conductive rod 1, and the second end of the air inlet duct 31 is away from the second end of the air outlet duct 32 by a preset distance. The length of the air inlet duct 31 in FIG. 4 is substantially equal to the length of the air inlet duct 31 in FIG. 2 and greater than the length of the air inlet duct 31 in FIG. 3, and the length of the air outlet duct 32 in FIG. 4 is substantially equal to the length of the air outlet duct 32 in FIG. 3 and greater than the length of the air outlet duct 32 in FIG. 2.

It will be noted that the above certain distances and the preset distance are each generally not less than 1 m. For example, the preset distance between the second end of the air inlet duct 31 and the second end of the air outlet duct 32 is not less than 1 m (e.g., may be 1 m, 1.5 m, 2 m, 2.5 m, or 3 m). In this way, it may avoid backflow of the hot air flow.

The air flow blown out from the tuyere of the fan 42 is blown into the air inlet 111 through the second end and the first end of the air inlet duct 31 in sequence, and then blown out from the first end and the second end of the air outlet duct 32 in sequence. In this way, it is convenient to arrange an installation position of the fan 42 depending on actual needs (e.g., the fan 42 is installed in the air inlet duct 31), so as to dissipate heat for the high-voltage bushing 01. In addition, since the second end of the air inlet duct 31 and the second end of the air outlet duct 32 are arranged at different positions, a situation that the air flow blown out from the air outlet duct 32 is blown into the conductive rod 1 from the air inlet duct 31 again will not occur, which may effectively prevent the backflow of the hot air flow.

In some embodiments, the air cooling device 010 may not be provided with the ventilation duct 3. In this case, the fan 42 may be arranged at the air inlet 111, and the air flow blown out by the tuyere of the fan 42 is directly blown into the air channel 1001 through the air inlet 111.

In order to facilitate the installation of the fan 42 at a suitable position, the air inlet duct 31 of the ventilation duct 3 may be connected to the air inlet 111.

In order to filter the air flow, in some embodiments, as shown in FIG. 1, the air cooling device 010 further includes a filter 0101, and the filter 0101 is disposed at the air inlet 111 to filter air flow entering the air channel 1001. For example, the filter 0101 is disposed in the air inlet duct 31. The filter 0101 is configured to filter impurities in the air flow to prevent the convection effect of the air flow from being affected by the accumulation of the impurities in the air flow inside the conductive rod 1.

In some embodiments, as shown in FIG. 12, the air cooling device 010 further includes air collecting hood(s) 41, and each fan 42 is arranged in a respective air collecting hood 41. The air collecting hood 41 has an opening 411, and the opening 411 is perpendicular to a gravity direction of the air collecting hood 41. For example, the air collecting hood 41 is configured in a shape with a closed top and an open bottom, and the opening 411 is located at the bottom of the air collecting hood 41.

The opening 411 of the air collecting hood 41 can collect external air flow, so that the external air flow may enter the air collecting hood 41 through the opening 411. The fan 42 in the air collecting hood 41 may blow the external air flow into the air inlet duct 31, and then cool down the conductive rod 1 through the air flow, so as to prevent insulation failure of the high-voltage bushing 01 due to excessive temperature.

In a case where the fan 42 is arranged in the second voltage equalizing ball 032, since the second end 022 of the high-voltage busbar 02 is connected to equipment such as the converter valve in the second voltage equalizing ball 032, an connection point thereof will generate a certain amount of heat due to an existence of a contact resistance, causing a temperature of the air flow in an upper portion of the second voltage equalizing ball 032 to be higher than a temperature of external environment. By arranging the air collecting hood 41 and making the opening 411 of the air collecting hood 41 face downward, the air flow in the upper portion of the second voltage equalizing ball 032 cannot easily enter the air collecting hood 41 through the opening 411, so that the temperature in the air collecting hood 41 is close to the temperature of the external environment, which is beneficial to improving the cooling effect of the high-voltage bushing 01.

Of course, in some embodiments, the air cooling device 010 may not be provided with the air collecting hood 41, and the fan 42 of the air cooling device 010 directly blows the external air flow into the air inlet duct 31.

In some embodiments, as shown in FIG. 12, the air cooling device 010 further includes a check valve 43 disposed at the inlet of the air inlet duct 31. The check valve 43 is configured to allow the air flow blown out by the fan 42 to be blown into the air inlet duct 31, and be able to prevent the air flow in the air inlet duct 31 from flowing back into the fan 42. In this way, the inlet of the air inlet duct 31 only allows the air flow to be blown into the air inlet duct 31, and the air flow in the air inlet duct 31 cannot flow back into the fan 42, which may effectively prevent the backflow of the air flow. In some embodiments, as shown in FIG. 12, the fan 42 includes a fan casing 421 and fan blades 422 located inside the fan casing 421. In a case where the air cooling device 010 includes the air collecting hood 41, the fan casing 421 is fixedly connected to the air collecting hood 41. For example, the fan casing 421 and the air collecting hood 41 are fixed through a fixing portion 423. The fixing portion 423 may be of a snap-fit structure. Alternatively, the fixing portion 423 is connected to the air collecting hood 41 and the fan casing 421 by welding. Here, the fixing portion 423 is not limited, as long as the fan casing 421 and the air collecting hood 41 can be fixed.

Figure 13:
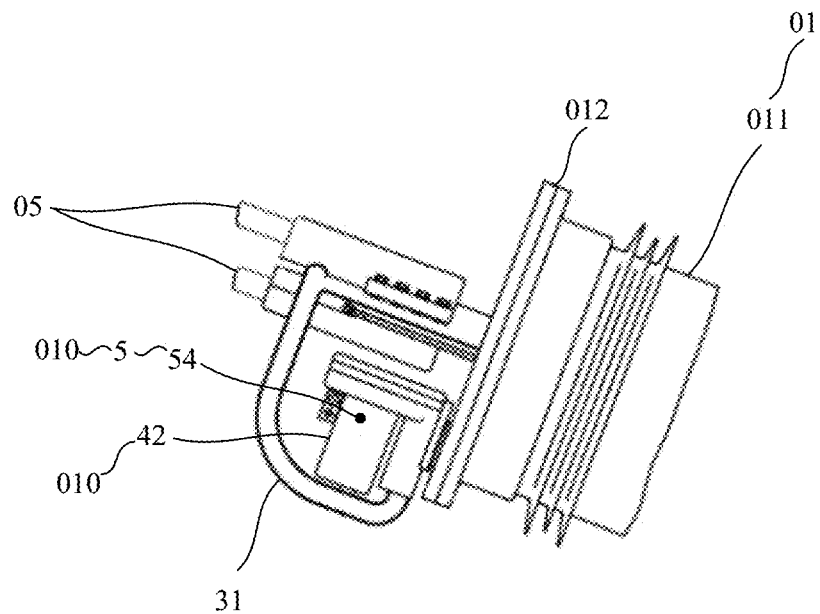
FIG. 13 illustrates a structural diagram showing a high-voltage power transmission system in which an end of a high-voltage bushing is provided with a fan, in accordance with some embodiments.

In some embodiments, as shown in FIG. 13, the high-voltage power transmission system 100 further includes a flange 012, the flange 012 is disposed at the first end of the conductive rod 1 of the high-voltage bushing 01, and the fan 42 in the air cooling device 010 is disposed at a side of the flange 012 away from the conductive rod 1. The air inlet duct 31 connected to the fan 42 is directly connected to the air inlet 111 of the air channel 1001 of the conductive rod 1. Therefore, a connection and arrangement of the air inlet duct 31 are simple, and an installation thereof may be carried out conveniently.

Figure 14:
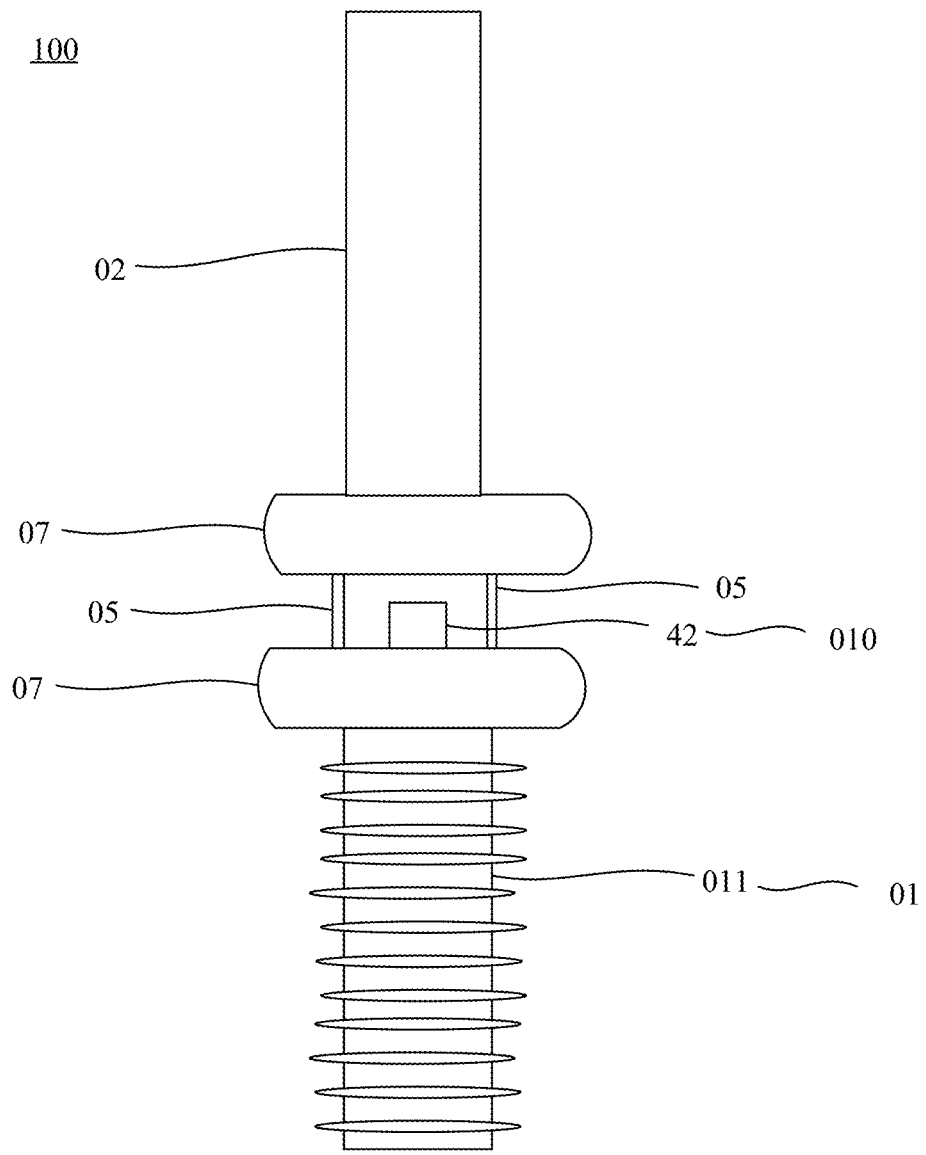
FIG. 14 illustrates a structural diagram showing a high-voltage power transmission system in which adjacent voltage equalizing rings, at an end of a high-voltage bushing, are provided with a fan therebetween, in accordance with some embodiments.

In some embodiments, as shown in FIG. 14, the high-voltage power transmission system 100 further includes a plurality of voltage equalizing rings 07, and the plurality of voltage equalizing rings 07 are arranged at a side of the first end of the conductive rod 1 of the high-voltage bushing 01. In this case, the fan 42 in the air cooling device 010 may be arranged between two adjacent voltage equalizing rings 07. By arranging the plurality of voltage equalizing rings 07, a voltage of the end of the high-voltage bushing 01 may be equalized, so that a voltage at each position of the end of the high-voltage bushing 01 is equal.

Figure 15:
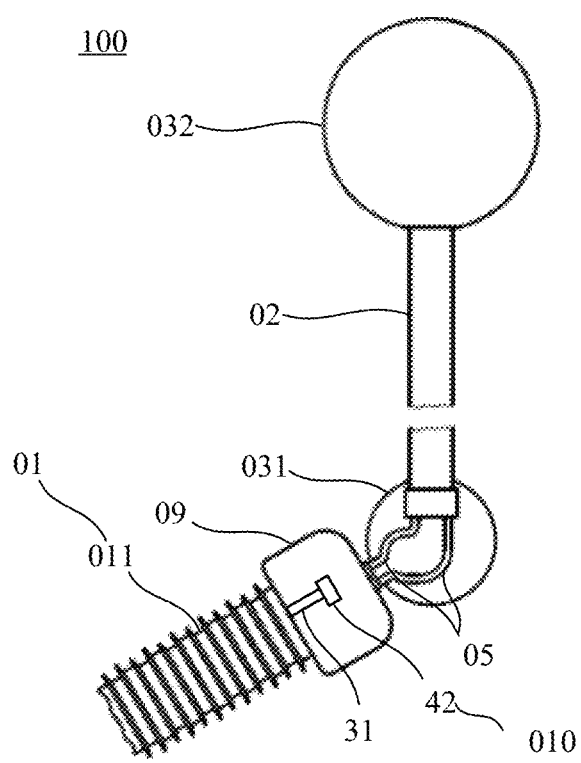
FIG. 15 illustrates a structural diagram showing a high-voltage bushing system in which a voltage equalizing hood, at an end of a high-voltage bushing, is provided with a fan therein, in accordance with some embodiments.

In some embodiments, as shown in FIG. 15, the high-voltage power transmission system 100 further includes a voltage equalizing hood 09, and the voltage equalizing hood 09 is arranged at the first end of the conductive rod 1 of the high-voltage bushing 01. The voltage equalizing hood 09 can play a role of homogenizing the electric field. The fan 42 in the air cooling device 010 is located in the voltage equalizing hood 09. In this case, the voltage equalizing hood 09 is located between the high-voltage bushing 01 and the fitting 05 (or the first voltage equalizing ball 031).

In some embodiments, as shown in FIG. 1, the air cooling device 010 further includes at least one sensor 5 and a controller 6. The at least one sensor 5 is configured to detect at least one of a pressure of the air flow output by the fan 42, a temperature of a bearing of the fan 42, a temperature of the conductive rod 1, or a temperature of the air flow. The controller 6 is configured to control an operating state of the fan 42 according to the at least one of the detected pressure of the air flow output by the fan 42, the detected temperature of the bearing of the fan 42, the detected temperature of the conductive rod 1, or the detected temperature of the air flow.

As shown in FIG. 1, information detected by the sensor 5 can be transmitted to the controller 6. After receiving the information, the controller 6 may control the fan 42 to run at different speeds. Thus, the controller 6 may control the fan 42 to operate at an appropriate speed according to the information transmitted by the sensor 5. In this way, a problem of energy waste caused by the overhigh speed of the fan 42 is not easy to occur, and the temperature of the high-voltage bushing 01 will not be too high, which is beneficial to keeping the temperature of the high-voltage bushing 01 in an appropriate range.

When the fan 42 is used to cool the conductive rod 1, it is necessary to obtain temperature change of the conductive rod 1. As shown in FIG. 2, the sensor 5 may be used to detect the temperature of the conductive rod 1. In order to more fully understand the temperature and cooling effect of the conductive rod 1, the temperatures at different positions of the conductive rod 1 may be detected. For example, the temperature of the air flow before entering the conductive rod 1 and the temperature of the air flow flowing out of the conductive rod 1 may be detected, and a temperature difference between the temperature of the air flow before entering the conductive rod 1 and the temperature of the air flow flowing out of the conductive rod 1 is calculated to understand the cooling effect of the conducting rod 1.

In some embodiments, as shown in FIGS. 1 to 4, the at least one sensor 5 may include a first temperature sensor 51, second temperature sensor(s) 52 and at least one third temperature sensor 53.

The first temperature sensor 51 is located at the air inlet 111, and the first temperature sensor 51 is configured to detect the temperature of the air flow blown into the air channel 1001. As shown in FIGS. 2, 3 and 4, since the air inlet 111 is connected to the air inlet duct 31, the first temperature sensor 51 may be arranged in the air inlet duct 31.

The second temperature sensor 52 is located at the air outlet 121, and the second temperature sensor 52 is configured to detect the temperature of the air flow flowing out of the air channel 1001. As shown in FIGS. 2, 3 and 4, since the air outlet 121 is connected to the air outlet duct 32, the second temperature sensor 52 may be arranged in the air outlet duct 32 that is connected to the air outlet 121.

Of course, in a case where the air cooling device 010 is not provided with the air inlet duct 31 and the air outlet duct 32, the first temperature sensor 51 and the second temperature sensor 52 may be arranged at other positions to detect the temperature of the air flow entering and flowing out of the air channel 1001.

Since the conductive rod 1 in the high-voltage bushing 01 is located inside the insulating sleeve 011, a middle position of the conductive rod 1 in the axis direction thereof is located in a central region of the insulating sleeve 011, and the heat near the middle position is not easily dissipated. Therefore, dissipation effect of the heat near the middle position of the conductive rod 1 in the axis direction thereof is poor.

In light of this, in a case where the at least one third temperature sensor 53 includes a single third temperature sensor 53, this third temperature sensor 53 may be arranged in a middle of an outer wall OW1 (as shown in FIG. 1) of the conductive rod 1 in its axial direction, and this third temperature sensor 53 is configured to detect the temperature of the conductive rod 1.

In order to more accurately detect the temperature at each position of the outer wall of the conductive rod 1, in some embodiments, the at least one third temperature sensor 53 includes a plurality of third temperature sensors 53.

As shown in FIG. 1, the plurality of third temperature sensors 53 are arranged on the outer wall OW1 of the conductive rod 1 and are spaced apart in the axial direction of the conductive rod 1. For example, in FIG. 1, the conductive rod 1 is provided with three third temperature sensors 53 thereon, and the three third temperature sensors 53 are spaced apart in the axial direction of the conductive rod 1. In this way, it is easy to obtain the temperature conditions at different positions of the conductive rod 1, and a situation where the local temperature of the conducting rod 1 is too high may be found in time.

It will be noted that the above descriptions of the arrangement position and quantity of the third temperature sensors 53 is only exemplary, and should not be construed as a limitation of the present disclosure. In practical applications, different numbers of third temperature sensors 53 may be set at different positions of the conductive rod 1 depending on requirements.

In addition, in order to detect the temperature of the bearing of the fan 42, as shown in FIG. 13, the at least one sensor 5 may further include a fourth temperature sensor 54, and the fourth temperature sensor 54 is located at a position of the bearing of the fan 42. The fourth temperature sensor 54 is configured to detect the temperature of the bearing of the fan 42 to obtain the operating condition of the fan 42.

In a case where the high-voltage bushing 01 is applied to a converter transformer, the high-voltage power transmission system 100 may further include a fifth temperature sensor. The fifth temperature sensor is configured to detect a temperature of oil inside a riser of converter transformer. Through the above at least one third temperature sensor 53 disposed on the outer wall of the conductive rod 1 and the fifth temperature sensor, a temperature difference between the conductive rod 1 and the riser of the converter transformer may be calculated.

In this way, the temperature of the high-voltage bushing 01 may be guaranteed to be in a range of 40° C. to 100° C., inclusive (e.g., 40° C., 50° C., 65° C., 80° C. or 90° C.), and the temperature difference between the temperature of the conductive rod 1 of the high-voltage bushing 01 and the temperature of the oil inside the riser of the converter transformer is within 40° C. (e.g., 15° C., 20° C., 25° C., 30° C. or 35° C.).

In some embodiments, as shown in FIG. 1, the at least one sensor 5 further includes an air pressure sensor 55, and the air pressure sensor 55 is located in the air inlet duct 31. In a case where the air cooling device 010 includes the filter 0101, the air pressure sensor 55 may detect whether the filter 0101 is blocked. The air pressure sensor 55 is configured to detect a pressure of air flow in the air inlet duct 31. In the case where the air cooling device 010 includes the filter 0101, it may be determined whether the filter 0101 is blocked according to the information fed back by the air pressure sensor 55.

In some embodiments, as shown in FIGS. 1 to 5, the air channel 1001 includes an air inlet channel 11 and an air outlet channel 12. A first end of the air inlet channel 11 and a first end of the air outlet channel 12 are both located at the first end of the conductive rod 1, the air inlet 111 is located at the first end of the air inlet channel 11, and the air outlet 121 is located at the first end of the air outlet channel 12. The second end of the air inlet channel 11 and the second end of the air outlet channel 12 communicate with each other at a position that is in the conductive rod 1 and is adjacent to the second end of the conductive rod 1. For example, for the descriptions of the first end and the second end, reference may be made to the left end and the right end in FIG. 5 respectively.

In order to better cool the inside of the conductive rod 1, the air channel 1001 includes the air inlet channel 11 and the air outlet channel 12. After entering the air inlet channel 11 through the air inlet 111, the external air flow enters the air outlet channel 12 at the position proximate to the second end of the conductive rod 1. After heat exchange, the air flow (e.g., hot air flow) is blown out from the air outlet 121 through the air outlet channel 12. Since the air inlet channel 11 and the air outlet channel 12 are provided separately, the heat exchange may be fully performed between the air flow and the air channel 1001, which is beneficial to improving the heat exchange efficiency.

Figure 5:
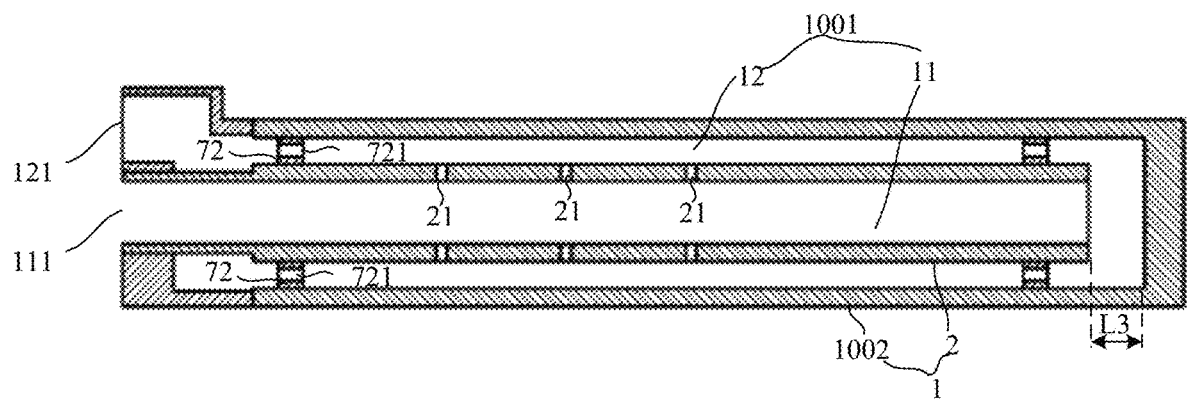
FIG. 5 illustrates a diagram showing an internal structure of a conductive rod in a high-voltage bushing, in accordance with some embodiments.

In some embodiments, as shown in FIG. 5, the conductive rod 1 further has a plurality of branch channels 21, and the plurality of branch channels 21 are configured to communicate the air inlet channel 11 with the air outlet channel 12. The air flow in the air inlet channel 11 may directly enter the air outlet channel 12 through the plurality of branch channels 21. In this way, the backflow of the air flow may be disturbed through the plurality of branch channels 21, which increases the turbulent flow, and improves the heat exchange effect.

In addition, some portions of the conductive rod 1 may also be directly cooled as required through the plurality of branch channels 21.

Figure 6:
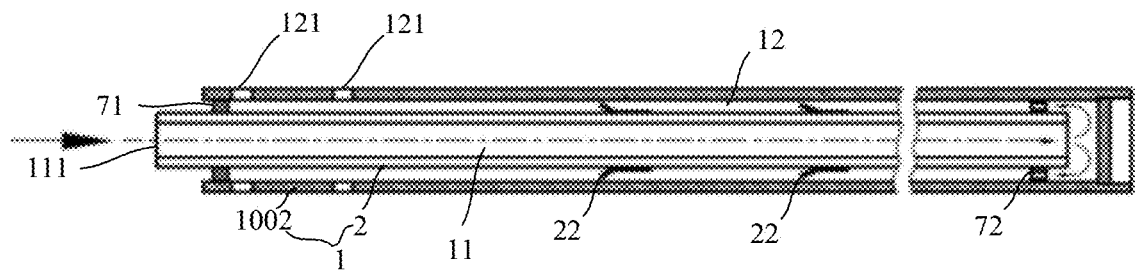
FIG. 6 illustrates a structural diagram of an air cooling pipe provided in a conductive rod in a high-voltage bushing, in accordance with some embodiments.
Figure 7:
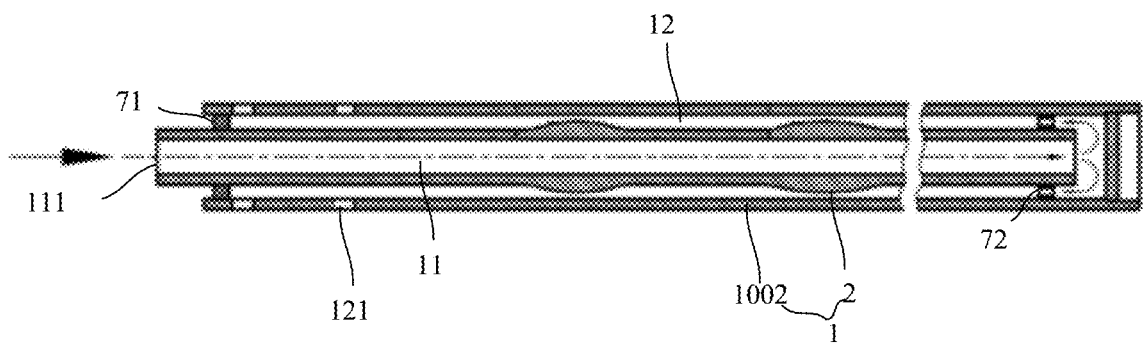
FIG. 7 illustrates a structural diagram of another air cooling pipe provided in a conductive rod in a high-voltage bushing, in accordance with some embodiments.

In some embodiments, in order to divide the air channel 1001 inside the conductive rod 1, as shown in FIGS. 5, 6 and 7, the conductive rod 1 includes a conductive rod body 1002 in a hollow structure and an air cooling pipe 2 disposed in the conductive rod body 1002 and extending in an axial direction of the conductive rod body 1002. A space inside the air cooling pipe 2 forms the air inlet channel 11, and a space between an outer wall OW2 (as shown in FIG. 5) of the air cooling pipe 2 and an inner wall IW1002 (as shown in FIG. 5) of the conductive rod body 1002 forms the air outlet channel 12.

A first end of the air cooling pipe 2 is substantially coplanar with a first end of the conductive rod body 1 (referring to FIG. 5), or the first end of the air cooling pipe 2 extends to the outside of the first end of the conductive rod body 1 (referring to FIGS. 6 and 7). A second end of the air cooling pipe 2 is spaced apart from an inner side of a second end of the conductive rod 1 by a predetermined distance (e.g., a distance L3 in FIG. 5), so that the air inlet channel 11 communicates with the air outlet channel 12. As a result, the air flow blown out by the fan 42 of the air cooling device 010 enters the inside of the air cooling pipe 2 through the air inlet duct 31, and flows out from the air outlet channel 12 located between the outer wall of the air cooling pipe 2 and the inner wall of the conductive rod 1, which makes the air flow exchange heat with the conductive rod 1 in all directions, and is beneficial to improving the overall cooling effect of the conductive rod 1.

Since the air cooling pipe 2 is installed inside the conductive rod 1, in order to fix the air cooling pipe 2, as shown in FIG. 5, the conductive rod 1 may further include at least one support portion 72 disposed in the air outlet channel 12, and the at least one support portion 72 is clamped between the outer wall of the air cooling pipe 2 and the inner wall of the conductive rod body 1002.

For example, the support portion 72 may be made of an insulating material, a surface of each support portion 72 abuts against the outer wall of the air cooling pipe 2, and an opposite surface of the support portion 72 abuts against the inner wall of the conductive rod body 1002. In this way, the support portion 72 is relatively firmly clamped between the outer wall of the air cooling pipe 2 and the inner wall of the conductive rod body 1002, so that the air cooling pipe 2 and the conductive rod body 1002 are substantially coaxial, which is beneficial to maintaining the relative stability of the space therebetween. In addition, the support portion 72 may further play a certain role of insulating and isolating current, and absorbing shock.

As shown in FIG. 5, in order to keep the air flow flowing smoothly, each support portion 72 has a flow opening 721. The flow opening 721 extends through the support portion 72 substantially in the axial direction of the conductive rod body 1002, and the flow opening 721 is configured to make the air flow pass therethrough smoothly.

In some embodiments, as shown in FIG. 6, the conductive rod 1 further includes guide vane(s) 22 arranged on the outer wall of the air cooling pipe 2, and the guide vane 22 is configured to guide the air flow blown into the air outlet channel 12 in a direction toward the air outlet 121. In this way, the air flow blown into the air outlet channel 12 may be guided by the guide vane 22, so that air flow with different speeds and directions may be acquired, which is beneficial to improving the cooling effect at different portions of the conductive rod 1.

It will be noted that the guide vane 22 may be installed on the outer wall of the air cooling pipe 2 by welding.

In some embodiments, as shown in FIG. 7, in the axial direction of the air cooling pipe 2, dimensions of outer diameters of the air cooling pipe 2 are not identical. Since the dimensions of the outer diameters of the air cooling pipe 2 are different, in the axial direction of the air cooling pipe 2, sizes of gaps between the outer wall of the air cooling pipe 2 and the inner wall of the conductive rod body 1002 are also different, and the direction of the air flow also changes in the process of flowing toward the air outlet 121. In this way, the air flow with different speeds and directions may also be acquired to achieve different cooling at different portions of the conductive rod 1.

Figure 10:
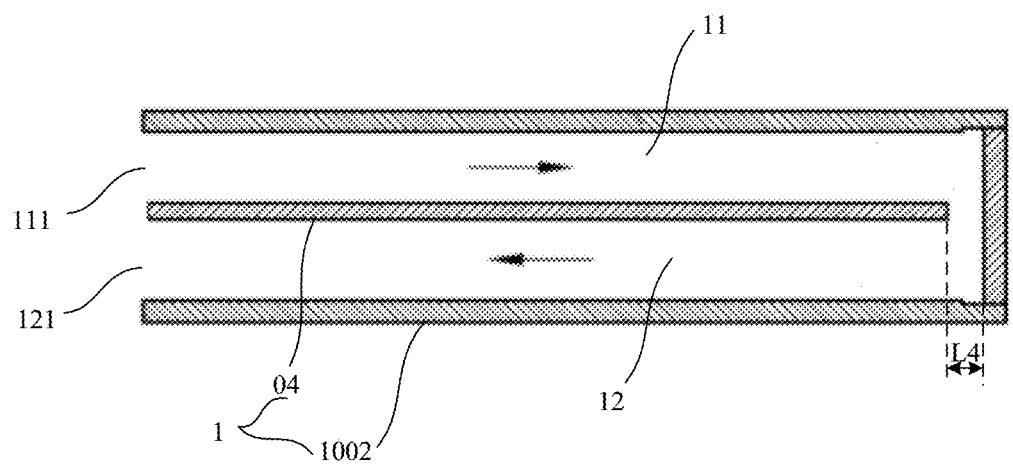
FIG. 10 illustrates a diagram showing an internal structure of yet another conductive rod in a high-voltage bushing, in accordance with some embodiments.

In some embodiments, in order to divide the air channel 1001 in the conductive rod 1, as shown in FIG. 10, the conductive rod 1 includes a conductive rod body 1002 in a hollow structure and a partition 04 disposed in the conductive rod body 1002 and extending in an axial direction of the conductive rod body 1002. The partition 04 divides a space inside the conductive rod body 1002 into the air inlet channel 11 and the air outlet channel 12 in a thickness direction of the partition 04. In FIG. 10, the air inlet channel 11 is defined by an inner wall of an upper portion of the conductive rod body and an upper surface of the partition 04, and the air outlet channel 12 is defined by an inner wall of a lower portion of the conductive rod body and a lower surface of the partition 04.

A first end of the partition 04 is substantially coplanar with a first end of the conductive rod 1; or the first end of the partition 04 extends to the outside of the first end of the conductive rod 1. A second end of the partition 04 is spaced apart from an inner side of a second end of the conductive rod 1 by a predetermined distance (e.g., a distance L4 in FIG. 10), so that the air inlet channel 11 communicates with the air outlet channel 12.

For example, as shown in FIG. 10, the partition 04 is located at a middle of the conductive rod body 1002. The air flow enters from the air inlet channel 11 in the upper portion of the conductive rod body, and then flows out from the air outlet channel 12 in the lower portion of the conductive rod body after exchanging heat with the conductive rod 1. The directions, in which the arrows in FIG. 10 show, represent flow directions of the air flow.

It will be noted that, in order to fix the partition 04 shown in FIG. 10 on the conductive rod body 1002, a fixing structure may be provided at a corresponding position inside the conductive rod body 1002. For example, a groove may be provided in the conductive rod body 1002, and the partition 04 may be provided at the corresponding groove.

Figure 8:
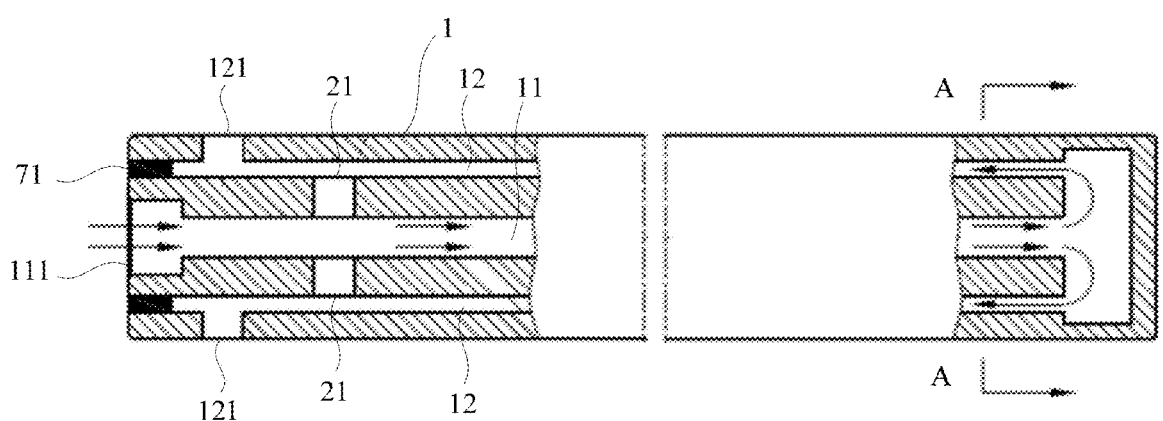
FIG. 8 illustrates a diagram showing an internal structure of another conductive rod in a high-voltage bushing, in accordance with some embodiments.
Figure 9:
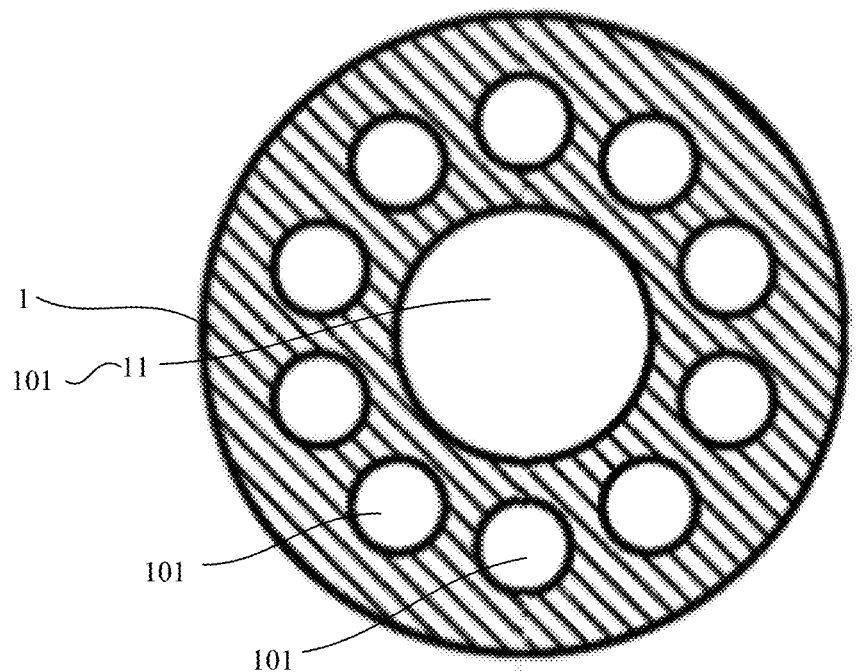
FIG. 9 illustrates a sectional view taken along the line A-A in FIG. 8.

In some embodiments, in order to divide the air channel 1001 in the conductive rod 1, as shown in FIGS. 8 and 9, the conductive rod 1 is provided with a plurality of through holes 101 therein, the plurality of through holes 101 extend substantially in the axial direction of the conductive rod 1, and the plurality of through holes 101 communicate with one another at an inner side of the second end of the conductive rod 1. A part of the plurality of through holes 101 forms the air inlet channel 11, and the other part of the plurality of through holes 101 forms the air outlet channel 12.

Diameters of the plurality of through holes 101 may be the same or different. For example, a diameter of a through hole 101 at a middle position may be greater than a diameter of each of through holes 101 at a peripheral position (referring to FIG. 9).

As shown in FIGS. 8 and 9, the conductive rod 1, which is integrally fabricated, has a honeycomb structure. For example, among the plurality of through holes 101, the through hole 101 at the middle position forms the air inlet channel 11, and the through holes 101 at an edge of the conductive rod 1 forms the air outlet channel 12.

As shown in FIG. 8, the air inlet channel 11 communicates with the air inlet 111 at the first end of the conductive rod 1. In a direction perpendicular to the axial direction of the conductive rod 1, the air outlet 121 is located in the outer wall of the conductive rod 1, and the air outlet 121 is disposed adjacent to the first end of the conductive rod 1. The air cooling device 010 further includes sealing heads 71, the sealing heads 71 are located at the first end of the conductive rod 1, and the sealing heads 71 are configured to seal the through holes 101, serving as the air outlet channel 12, among the plurality of through holes 101, so that the air flow can flow out from the air outlet 121.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

It will be appreciated by those skilled in the art that the scope of disclosure involved in the present disclosure is not limited to technical solutions formed by particular combinations of the above technical features, but shall also encompass other technical solutions formed by any combination of the above technical features or equivalents thereof without departing from the concept of present disclosure. For example, technical solutions formed by replacing the above features with technical features with similar functions disclosed in some embodiments (but not limited thereto).

What is claimed is:

1. A high-voltage bushing, comprising:
   a conductive rod having an air channel therein, the air channel including an air inlet and an air outlet; and
   an air cooling device including at least one fan, the fan being configured to output air flow, so as to blow the air flow into the air channel through the air inlet;
   wherein the air channel further includes an air inlet channel and an air outlet channel, wherein a first end of the air inlet channel and a first end of the air outlet channel are located at a first end of the conductive rod; the air inlet is located at the first end of the air inlet channel, and the air outlet is located at the first end of the air outlet channel; and a second end of the air inlet channel and a second end of the air outlet channel communicate with each other at a position that is in the conductive rod and is adjacent to a second end of the conductive rod; and
   the conductive rod is provided with a plurality of through holes therein, and the plurality of through holes each extend in an axial direction of the conductive rod and communicate with one another at an inner side of the second end of the conductive rod; a part of the plurality of through holes forms the air inlet channel, and another part forms the air outlet channel.

2. The high-voltage bushing according to claim 1, wherein the air cooling device further includes:
   at least one sensor configured to detect at least one of a pressure of the air flow output by the fan, a temperature of a bearing of the fan, a temperature of the conductive rod, or a temperature of the air flow; and
   a controller configured to control an operating state of the fan according to the at least one of the detected pressure of the air flow output by the fan, the detected temperature of the bearing of the fan, the detected temperature of the conductive rod, or the detected temperature of the air flow.

3. The high-voltage bushing according to claim 2, wherein the at least one sensor includes at least one of:
   a first temperature sensor located at the air inlet, the first temperature sensor being configured to detect the temperature of the air flow before blowing into the air channel;
   a second temperature sensor located at the air outlet, the second temperature sensor being configured to detect a temperature of air flow flowing out of the air channel;
   at least one third temperature sensor located on an outer wall of the conductive rod, each third temperature sensor being configured to detect the temperature of the conductive rod; or
   a fourth temperature sensor located on the bearing of the fan, the fourth temperature sensor being configured to detect the temperature of the bearing of the fan.

4. The high-voltage bushing according to claim 3, wherein the at least one third temperature sensor includes a single third temperature sensor, and the single third temperature sensor is disposed on a middle of the outer wall of the conductive rod in an axial direction of the conductive rod; or
   the at least one third temperature sensor includes a plurality of third temperature sensors, and the plurality of third temperature sensors are disposed on the outer wall of the conductive rod and are spaced apart in the axial direction of the conductive rod; or
   the air cooling device further includes a ventilation duct, wherein the ventilation duct includes an air inlet duct, an inlet of the air inlet duct communicates with a tuyere of the fan, and an outlet of the air inlet duct communicates with the air inlet of the air channel; the at least one sensor further includes an air pressure sensor, and the air pressure sensor is configured to detect a pressure of an air flow in the air inlet duct.

5. The high-voltage bushing according to claim 1, wherein the air cooling device further includes:
a ventilation duct, wherein the ventilation duct includes an air inlet duct, an inlet of the air inlet duct communicates with a tuyere of the fan, and an outlet of the air inlet duct communicates with the air inlet of the air channel.

6. The high-voltage bushing according to claim 5, wherein the air cooling device further includes a check valve disposed at the inlet of the air inlet duct, and the check valve is configured to allow the air flow generated by the fan to be blown into the air inlet duct, and prevent air flow in the air inlet duct from flowing back into the fan; and/or
the ventilation duct further includes an air outlet duct, and the air outlet duct communicates with the air outlet.

7. The high-voltage bushing according to claim 1, wherein
the at least one fan includes a plurality of fans; and/or
the air cooling device further includes at least one air collecting hood, and each fan is disposed in a respective air collecting hood; the air collecting hood has an opening, and the opening is perpendicular to a gravity direction of the air collecting hood; and/or
the air cooling device further includes a filter, and the filter is disposed at the air inlet and is configured to filter the air flow entering the air channel.

8. A high-voltage bushing, comprising:
a conductive rod having an air channel therein, the air channel including an air inlet and an air outlet; and
an air cooling device including at least one fan, the fan being configured to output air flow, so as to blow the air flow into the air channel through the air inlet;
wherein the air channel further includes an air inlet channel and an air outlet channel, wherein a first end of the air inlet channel and a first end of the air outlet channel are located at a first end of the conductive rod; the air inlet is located at the first end of the air inlet channel, and the air outlet is located at the first end of the air outlet channel; and a second end of the air inlet channel and a second end of the air outlet channel communicate with each other at a position that is in the conductive rod and is adjacent to a second end of the conductive rod;
the conductive rod includes a conductive rod body in a hollow structure, and an air cooling pipe disposed in the conductive rod body and extending in an axial direction of the conductive rod body; and a space inside the air cooling pipe forms the air inlet channel, and a space between an outer wall of the air cooling pipe and an inner wall of the conductive rod body forms the air outlet channel; and
the conductive rod includes at least one support portion disposed in the air outlet channel, and the at least one support portion is clamped between the outer wall of the air cooling pipe and the inner wall of the conductive rod body.

9. The high-voltage bushing according to claim 8, wherein the support portion has a flow opening, the flow opening extends through the support portion substantially in the axial direction of the conductive rod body.

10. The high-voltage bushing according to claim 8, wherein the conductive rod further includes a guide vane disposed on the outer wall of the air cooling pipe, and the guide vane is configured to guide air flow blown into the air outlet channel in a direction toward the air outlet; or
in an axial direction of the air cooling pipe, outer diameters of the air cooling pipe are not identical.

11. The high-voltage bushing according to claim 1, wherein among the plurality of through holes, a through hole located in a middle of the conductive rod forms the air inlet channel, and through holes located at an edge of the conductive rod form the air outlet channel.

12. A high-voltage power transmission system, comprising:
a high-voltage busbar; and
a high-voltage bushing, the high-voltage bushing being the high-voltage bushing according to claim 1, and the conductive rod in the high-voltage bushing being connected to the high-voltage busbar.

13. The high-voltage power transmission system according to claim 12, further comprising:
a fitting; and
a first voltage equalizing ball and a second voltage equalizing ball, wherein a first end of the high-voltage busbar is connected to a first end of the conductive rod in the high-voltage bushing through the fitting located in the first voltage equalizing ball, and a second end of the high-voltage busbar is located in the second voltage equalizing ball.

14. The high-voltage power transmission system according to claim 12, wherein the high-voltage power transmission system further comprises a first voltage equalizing ball and a second voltage equalizing ball, and the fan is located in the first voltage equalizing ball or the second voltage equalizing ball; or
the high-voltage power transmission system further comprises a voltage equalizing hood, the voltage equalizing hood is located at a first end of the high-voltage bushing, and the fan is located in the voltage equalizing hood; or
the high-voltage power transmission system further comprises a plurality of voltage equalizing rings, the plurality of voltage equalizing rings are located at a side of the first end of the high-voltage bushing, and the fan is located between two adjacent voltage equalizing rings; or
the high-voltage power transmission system further comprises a flange, the flange is located at the first end of the high-voltage bushing, and the fan is disposed at a side of the flange away from the conductive rod.

15. The high-voltage power transmission system according to claim 12, further comprising:
a high-potential energy extraction device, an output terminal of the high-potential energy extraction device being connected to the air cooling device, and the high-potential energy extraction device being configured to extract electrical energy from the high-voltage busbar and supply power to the air cooling device.

16. The high-voltage bushing according to claim 8, wherein the conductive rod further has a plurality of branch channels, and the plurality of branch channels communicate the air inlet channel with the air outlet channel.

17. A high-voltage bushing, comprising:
a conductive rod having an air channel therein, the air channel including an air inlet and an air outlet; and
an air cooling device including at least one fan, the fan being configured to output air flow, so as to blow the air flow into the air channel through the air inlet;

wherein the air channel further includes an air inlet channel and an air outlet channel, wherein a first end of the air inlet channel and a first end of the air outlet channel are located at a first end of the conductive rod; the air inlet is located at the first end of the air inlet channel, and the air outlet is located at the first end of the air outlet channel; and a second end of the air inlet channel and a second end of the air outlet channel communicate with each other at a position that is in the conductive rod and is adjacent to a second end of the conductive rod; and the conductive rod includes a conductive rod body in a hollow structure, and a partition disposed in the conductive rod body and extending in an axial direction of the conductive rod body, and the partition divides a space inside the conductive rod body into the air inlet channel and the air outlet channel in a thickness direction of the partition.

* * * * *